(12) United States Patent
Gagliardi et al.

(10) Patent No.: US 8,591,764 B2
(45) Date of Patent: Nov. 26, 2013

(54) CHEMICAL MECHANICAL PLANARIZATION COMPOSITION, SYSTEM, AND METHOD OF USE

(75) Inventors: John J. Gagliardi, Hudson, WI (US); Patricia M. Savu, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 756 days.

(21) Appl. No.: 11/613,646

(22) Filed: Dec. 20, 2006

(65) Prior Publication Data

US 2008/0153392 A1   Jun. 26, 2008

(51) Int. Cl.
B24B 7/04   (2006.01)

(52) U.S. Cl.
USPC ............................................ 252/79.3; 51/307

(58) Field of Classification Search
USPC .................. 438/692; 216/88, 89; 156/345.12; 51/307; 252/79.3, 79.4
See application file for complete search history.

(56) References Cited

U.S. PATENT DOCUMENTS

| | | | |
|---|---|---|---|
| 5,114,437 A | 5/1992 | Takeuchi et al. | |
| 5,152,917 A | 10/1992 | Pieper et al. | |
| 5,690,539 A * | 11/1997 | Swidler et al. | 451/38 |
| 5,738,800 A | 4/1998 | Hosali et al. | |
| 5,954,997 A | 9/1999 | Kaufman et al. | |
| 5,958,794 A | 9/1999 | Bruxvoort et al. | |
| 6,121,143 A | 9/2000 | Messner et al. | |
| 6,136,711 A | 10/2000 | Grumbine et al. | |
| 6,194,317 B1 | 2/2001 | Kaisaki et al. | |
| 6,477,926 B1 * | 11/2002 | Swisher et al. | 451/526 |
| 6,491,843 B1 | 12/2002 | Srinivasan et al. | |
| 6,524,376 B2 | 2/2003 | Aoki et al. | |
| 6,544,892 B2 | 4/2003 | Srinivasan et al. | |
| 6,627,107 B2 | 9/2003 | Srinivasan et al. | |
| 6,702,954 B1 | 3/2004 | Her et al. | |
| 6,863,592 B2 | 3/2005 | Lee et al. | |
| 6,896,825 B1 | 5/2005 | Uchida et al. | |
| 6,964,923 B1 | 11/2005 | Ronay | |
| 6,997,785 B1 | 2/2006 | Rueb et al. | |
| 7,063,597 B2 | 6/2006 | Prabhu et al. | |
| 7,071,105 B2 | 7/2006 | Carter et al. | |
| 7,091,164 B2 | 8/2006 | Srinivasan et al. | |
| 7,238,618 B2 * | 7/2007 | Mueller et al. | 438/689 |
| 2002/0017630 A1 | 2/2002 | Uchida et al. | |
| 2002/0059755 A1 | 5/2002 | Kido et al. | |
| 2002/0092423 A1 * | 7/2002 | Gillingham et al. | 95/287 |
| 2003/0176151 A1 | 9/2003 | Tam et al. | |
| 2004/0060502 A1 * | 4/2004 | Singh | 117/68 |
| 2004/0142640 A1 | 7/2004 | Prabhu et al. | |
| 2004/0157454 A1 | 8/2004 | Her et al. | |
| 2005/0028450 A1 | 2/2005 | Xu et al. | |
| 2005/0032462 A1 | 2/2005 | Gagliardi et al. | |
| 2005/0050803 A1 * | 3/2005 | Amanokura et al. | 51/309 |
| 2005/0076581 A1 | 4/2005 | Small et al. | |
| 2005/0079709 A1 | 4/2005 | Delehanty et al. | |
| 2005/0130428 A1 | 6/2005 | Choi et al. | |
| 2005/0136673 A1 | 6/2005 | Xu et al. | |
| 2005/0153643 A1 | 7/2005 | Simpson et al. | |
| 2005/0191823 A1 | 9/2005 | Horikawa et al. | |
| 2006/0000808 A1 | 1/2006 | Seki et al. | |
| 2006/0075688 A1 | 4/2006 | Takenouchi | |
| 2006/0144824 A1 * | 7/2006 | Carter et al. | 216/89 |
| 2006/0196848 A1 | 9/2006 | Carter et al. | |
| 2006/0234509 A1 * | 10/2006 | Small et al. | 438/692 |

FOREIGN PATENT DOCUMENTS

| | | |
|---|---|---|
| EP | 1 106 663 A1 | 6/2001 |
| EP | 1 612 249 A1 | 1/2006 |
| EP | 1 642 949 A1 | 4/2006 |
| EP | 1 661 961 A2 | 5/2006 |
| JP | 05-112775 | 5/1993 |

OTHER PUBLICATIONS

Yukishige Kondo, et. al. "Journal Fluorine Chemistry" vol. 91(1998)147-151.*
Journal of Fluorine Chemistry vol. 9 (1998)147-151.*
Tonshoff et al., "Abrasive Machining of Silicon", *Annals of the CIRP*, vol. 39/2 (1990), pp. 621-635.
Gagliardi et al., "3M SlurryFree™ CMP Fixed Abrasives for Direct HDP STI CMP", Technical Brief, Jun. 2001.
Gagliardi et al., "Fixed Abrasives and Selective Chemistries: Some Real Advantages for Direct STI CMP", CMP-MIC Conference, Santa Clara, CA, Mar. 2002.
Nickles et al., "Slurryless Fixed-Abrasive Web for Direct Polish STI CMP", SEMICON Korea STS 2003.

* cited by examiner

*Primary Examiner* — Michael Cleveland
*Assistant Examiner* — Tabassom Tadayyon Eslami
(74) *Attorney, Agent, or Firm* — James A. Baker; Adam Bramwell

(57) ABSTRACT

The disclosure relates to chemical mechanical planarization (CMP) polishing compositions including proline and a fluorochemical surfactant. The wafer polishing composition may be used as a solution substantially free of abrasive particles, the composition of which can be adjusted to control Oxide Removal Rate and oxide over nitride Selectivity Ratio in Shallow Trench Isolation (STI) processing of semiconductor wafers using a fixed abrasive CMP process. In certain embodiments, the disclosure provides a working liquid for fixed abrasive CMP including proline and a fluorochemical surfactant at a pH from 9 to 11. When used in a fixed abrasive CMP system and method for STI, exemplary working liquids may yield an Oxide Removal Rate of at least 500 angstroms per minute, and an oxide over nitride Selectivity Ratio of at least 5.

16 Claims, No Drawings

CHEMICAL MECHANICAL PLANARIZATION COMPOSITION, SYSTEM, AND METHOD OF USE

TECHNICAL FIELD

The disclosure relates generally to a composition for chemical mechanical planarization (CMP). More particularly, the disclosure relates to a composition that can be used with a fixed abrasive article in a CMP system and method.

BACKGROUND

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff et al., "Abrasive Machining of Silicon", published in the Annals of the International Institution for Production Engineering Research, (Volume 39/2/1990), pp. 621-635. In each manufacturing step, it is often necessary or desirable to modify or refine an exposed surface of the wafer in order to prepare the wafer for subsequent fabrication or manufacturing steps. For example, semiconductor wafers having shallow trench isolation (STI) structures require planarization of the dielectric material prior to further processing One method of modifying or refining exposed surfaces of wafers employs processes that treat a wafer surface with a slurry containing a plurality of loose abrasive particles dispersed in a liquid. Typically this slurry is applied to a polishing pad and the wafer surface is then ground or moved against the pad in order to remove or take off material from the wafer surface. Generally, the slurry also contains additives that chemically react with the wafer surface and which may provide CMP process selectivity, for example, "stop on nitride" selectivity. This type of process is commonly referred to as a slurry-based chemical-mechanical planarization (CMP) process.

One limitation of slurry-based CMP processes, however, is that the slurry abrasive processes must be carefully monitored in order to achieve a desired wafer surface topography and avoid dishing of the wafer surface. A second limitation is potential for scratching the wafer surface associated with use of loose abrasive slurries. Another limitation is the mess associated with slurries, and the large number of particles that must be removed from the surface of the wafer and disposed of following wafer treatment. Handling and disposal of these slurries generates additional processing costs for the semiconductor wafer fabricator.

An alternative to slurry-based CMP processes uses an abrasive article to modify or refine a semiconductor surface. A CMP process that uses abrasive articles has been reported, for example, by Bruxvoort et al. in U.S. Pat. No. 5,958,794 and by Kaisaki et al. in U.S. Pat. No. 6,194,317. The disclosed abrasive articles may have a textured abrasive surface that includes abrasive particles dispersed in a binder. In use, the abrasive article may be contacted with a semiconductor wafer surface, often in the presence of a fluid or working liquid to provide a planar, uniform wafer surface. Use of an abrasive article overcomes some, but not all limitations associated with CMP slurries. The art continually searches for new and improved abrasive compositions and methods for slurry-free CMP processes.

SUMMARY

The present disclosure relates generally to a composition, system and method for modifying an exposed surface of a semiconductor wafer. More particularly, the present disclosure relates to a composition that can be adjusted to control Oxide Removal Rate and Selectivity Ratio for modifying semiconductor wafers using a fixed abrasive CMP process.

In one aspect, the disclosure provides a working liquid substantially free of abrasive particles and including proline and a fluorochemical surfactant. In some embodiments, the working liquid is useful in chemical mechanical planarization (CMP) using a fixed abrasive article.

In another aspect, the disclosure provides a wafer planarization system including a three-dimensional, textured, fixed abrasive article, and a working liquid including proline and a fluorochemical surfactant. In some embodiments, the fixed abrasive article includes a multiplicity of abrasive particles and a binder. In certain embodiments, the working liquid exhibits a pH from 9 to 11 and is substantially free of abrasive particles. In some systems, the abrasive article includes precisely shaped abrasive composites.

In a further aspect, the disclosure provides a method for polishing a wafer by providing a wafer comprising a first region comprising silicon dioxide and a second region comprising silicon nitride, contacting the wafer with a three-dimensional, textured, fixed abrasive article comprising a plurality of abrasive particles and a binder, and relatively moving the wafer and the fixed abrasive article in the presence of a liquid medium comprising proline and a fluorochemical surfactant. In some embodiments, the working liquid exhibits a pH from 9 to 11. In certain embodiments, the working liquid exhibits a pH from 10 to 10.5.

The compositions and methods of the present disclosure unexpectedly enhance the performance of chemical mechanical planarization processes that use fixed abrasives rather than polishing pads and slurries. The use of a fluorochemical surfactant in solutions with proline in fixed abrasive CMP processes has been found to achieve high dielectric oxide material removal rates while maintaining stop on nitride selectivity.

The removal rate of dielectric material (e.g. metal oxide such as silicon dioxide) may be, in some embodiments, an important characteristic of the fixed abrasive CMP process affected by the composition of the working fluid, particularly the concentration of the fluorochemical surfactant. In some embodiments, the working liquid is selected to have an Oxide Removal Rate of at least about 500 angstroms per minute (Å/min.). In other embodiments, the working liquid is selected to have an Oxide Removal Rate of at least 700 Å/min.

In further embodiments, the composition of the working fluid is selected, at least in part, to increase the Oxide Removal Rate and the Selectivity Ratio. In one embodiment of the present disclosure, the use of a fluorochemical surfactant with proline under alkaline pH conditions increases the Oxide Removal Rate while retaining the nitride removal rate in Shallow Trench Isolation (STI), thereby increasing the oxide over nitride Selectivity Ratio associated with the use of proline in the working fluid of a fixed abrasive CMP process for STI. In certain embodiments, the compositions of the present disclosure may produce an Oxide Removal Rate of at least about 500 Å/min. and an oxide over nitride Selectivity Ratio of at least 5. In other exemplary embodiments, the compositions of the present disclosure may produce an Oxide Removal Rate of at least 700 Å/min., and a Selectivity Ratio of at least 30.

In some embodiments, the fluorochemical surfactant concentration is selected, at least in part, to control Oxide Removal Rate. In exemplary embodiments, the fluorochemical surfactant concentration is selected to be greater than 0.005%, and in certain embodiments, at least 0.02% of the working liquid on a weight basis. In other exemplary embodiments, the fluorochemical surfactant concentration is less than 1.0%, and in certain embodiments, no more than 0.6% on a weight basis.

Some embodiments of the present disclosure provide certain advantages over the art pertaining to slurry-based CMP. In some embodiments, the composition, system and method of the present disclosure may provide reduced dishing of a wafer surface, an ability to use lower CMP pad pressure, and improved control of the CMP process relative to a slurry-based CMP process. Other embodiments of the present disclosure provide certain advantages over the art pertaining to fixed abrasive CMP. In some embodiments, the composition, system and method of the present disclosure may provide a rapid Oxide Removal Rate and an increase in oxide over nitride Selectivity Ratio even at a moderately alkaline pH condition, for example, pH 9-11.

The above Summary is not intended to describe each disclosed embodiment or every implementation of the present disclosure and their advantages. The Detailed Description that follows more particularly exemplifies illustrative embodiments. Other advantages will be apparent to one skilled in the art from this disclosure.

DETAILED DESCRIPTION

In the context of the present disclosure:

"Abrasive composite" refers to one of a plurality of shaped bodies that collectively provide a textured, three-dimensional abrasive article comprising abrasive particles distributed within a binder;

"fixed abrasive article" refers to an integral abrasive article that is substantially free of unattached abrasive particles except as may be generated during the planarization process;

"precisely shaped abrasive composite" refers to an abrasive composite having a molded shape that is the inverse of the mold cavity that is retained after the composite has been removed from the mold, wherein the composite can be substantially free of abrasive particles protruding beyond the exposed surface of the shape before the abrasive article has been used, as described by Pieper et al. in U.S. Pat. No. 5,152,917;

"textured abrasive article" refers to an abrasive article having raised portions and recessed portions in which at least the raised portions contain abrasive particles and binder;

"three-dimensional abrasive article" refers to an abrasive article having numerous abrasive particles extending throughout at least a portion of its thickness such that removing some of the particles during planarization exposes additional abrasive particles capable of performing the planarization function;

"wafer" refers to a semiconductor wafer in the form of a blank wafer (i.e., a wafer prior to processing for the purpose of adding topographical features such as metallized and insulating areas) or a processed wafer (i.e., a wafer after it has been subjected to one or more processing steps to add topographical features to the wafer surface);

"Oxide Removal Rate" refers to the rate or speed, generally expressed in angstroms per minute (Å/min.), at which a dielectric oxide material may be removed from a wafer during a CMP process.

"Selectivity Ratio" refers to the ratio of the rate at which a first material (e.g., a dielectric oxide material such as silicon dioxide) can be removed, to the rate at which a second material (e.g., a barrier material such as silicon nitride) can be removed from a wafer during a CMP process.

In some embodiments, the disclosure provides a composition, system and method in which a working liquid substantially free of abrasive particles and including proline and a fluorochemical surfactant is used in a fixed abrasive CMP process. In some embodiments, the composition is a working liquid used with a fixed abrasive article in a fixed abrasive CMP system. The fixed abrasive CMP composition, system and method may be useful for shallow trench isolation (STI) of a patterned wafer, in which it may be desirable to use a selective chemistry in the working liquid to obtain "stop on nitride" oxide removal selectivity, as described in U.S. Pat. No. 6,997,785 to Rueb et al., the entire disclosure of which is incorporated herein by reference.

In STI, a wafer having a base and a plurality of shallow trench isolation structures is provided. The shallow trench isolation structures are typically formed by depositing and patterning a silicon nitride layer to form a mask on the surface of the wafer, and then forming trenches using any of the etching processes known to those skilled in the art. A dielectric layer may be deposited over the surface of the shallow trench isolation structures and into the spaces between the shallow trench isolation structures. A variety of dielectric materials may be used, such as, for example, silicon dioxide. As used in the context of the present disclosure, "silicon dioxide" refers to silicon dioxide as well as doped variants of silicon dioxide, such as, for example, fluorine, boron, and/or phosphorous doped silicon dioxide.

A portion of the dielectric layer is then removed using the CMP process of the present disclosure to form the desired pattern. The polished dielectric material and a nitride mask layer form a generally flat surface. The mask layer functions as a stop layer for the CMP process that protects the shallow trench isolation structure from exposure to the CMP processing. The mask layer is typically produced using a nitride material, for example, silicon nitride. It has been demonstrated that use of a fixed abrasive article and working liquid according to the present disclosure may provide reduced dishing of a wafer in a fixed abrasive CMP process as compared to a slurry-based CMP process.

CMP machines useful with the processes of the present disclosure are commercially available and known to those skilled in the art. Exemplary CMP machines are commercially available from Applied Materials, Santa Clara, Calif., for example machines marketed as "APPLIED MATERIALS MIRRA™ CMP POLISHER," and "REFLEXION WEB™." A CMP machine useful for the process of the present disclosure may be fitted with a fixed abrasive polishing article as reported, for example, by Bruxvoort et al. in U.S. Pat. No. 5,958,794 and by Kaisaki et al. in U.S. Pat. No. 6,194,317, the disclosures of which are incorporated herein by reference.

The abrasive article may be used to polish the exposed surface of the wafer in the presence of a liquid medium (i.e., working liquid). Abrasive articles useful for the method of the present disclosure typically have a diameter in the range of 250 to 1,000 millimeters. The abrasive article may rotate at a speed of at least 5 revolutions per minute (rpm), more preferably 10 rpm. The abrasive article preferably rotates at a speed of at most 10,000 rpm, more preferably at a speed of at most 1,000 rpm, more preferably still at a speed of at most 250 rpm, most preferably at a speed of at most 60 rpm. In some embodiments, the abrasive article and the wafer may be rotated in the same direction. In other embodiments, the wafer and the abrasive article may be rotated in opposite directions.

The abrasive article can also be provided in other configurations, including, for example, sheets, rolls, or belts. In these configurations, the abrasive article can, for example, be fed linearly into the CMP process during polishing operations.

The abrasive article can be selected to be long lasting, e.g., the abrasive article can be selected, at least in part, to polish a minimum number of different wafers. The abrasive article can also be selected based on Oxide Removal Rate. Additionally, the abrasive article can be selected based on its capability of yielding a semiconductor wafer having a desired flatness, surface finish, and minimal dishing. The materials, desired texture, and process used to make the abrasive article can all influence whether or not these criteria are met.

Abrasive articles useful in the CMP process of the present disclosure include those reported by Bruxvoort et al. in U.S. Pat. No. 5,958,794 and by Kaisaki et al. in U.S. Pat. No. 6,194,317, incorporated herein by reference. In certain embodiments, a three-dimensional, textured, fixed abrasive article is used. In some embodiments, the abrasive article comprises ceria abrasive particles. In yet further embodiments, the abrasive articles comprise precisely shaped abrasive composites.

Exemplary abrasive articles having precisely shaped abrasive composites comprising ceria particles that are useful for the processes of the present disclosure include those commercially available from 3M Company, St. Paul, Minn., and marketed as "3M SLURRYFREE CMP FIXED ABRASIVE 3152" and "3M SLURRYFREE CMP FIXED ABRASIVE 3154". A presently preferred abrasive article having precisely shaped abrasive composites is a fixed abrasive pad sold under the product designation SWR542-125/10 by 3M Company, St. Paul, Minn.

During CMP processing using the processes of the present disclosure, a working liquid is present at the interface between the abrasive article and the wafer. Typically, during planarization, there is a consistent flow of the working liquid to the interface between the abrasive article and the wafer. The liquid flow rate typically is at least about 10 milliliters per minute (ml/min.), more preferably at least 25 ml/min. The liquid flow rate typically is at most about 10,000 ml/min., more preferably at most about 500 ml/min., most preferably at most about 250 ml/min.

The working liquid of the present disclosure comprises proline and a fluorochemical surfactant, and is substantially free of abrasive particles. In some embodiments, L-proline may be used with a fluorochemical surfactant. The working liquid may also comprise water, and additives such as complexing agents, buffers, dispersing agents, and the like.

In some embodiments, the working liquid is adjusted to a pH of at least about 9. In other embodiments, the working liquid is adjusted to a pH of at least about 10. In certain presently preferred embodiments, the working liquid pH is adjusted to about 10.5. In certain of these embodiments, the working liquid is adjusted to a pH that is no greater than about 11. In some embodiments, the working liquid is adjusted to a pH that is no greater than about 10.5. In some embodiments, the working liquid is adjusted to a pH in the range of about 9 to about 11. In some embodiments, the working liquid is adjusted to a pH in the range of about 10 to about 10.5. The pH can be adjusted using methods and solutions known to those skilled in the art, including, for example, the addition of KOH or $NH_4OH$. In some embodiments, the working liquid is buffered. In some embodiments, the working liquid may be buffered using other amino acids, for example, histidine, glycine, lysine, arginine, and the like.

In some embodiments, the working liquid comprises at least 0.1% proline by weight. In other embodiments, the working liquid comprises at least 0.5% proline by weight. In yet further embodiments, the working liquid comprises at least 1% proline by weight. In some embodiments, the working liquid comprises about 2.5% proline by weight. In certain of these embodiments, the working liquid comprises at most 8% proline by weight. In some embodiments, the working liquid comprises at most 5% proline by weight. In yet further embodiments, the working liquid comprises at most 3% proline by weight.

The fluorochemical surfactant can be virtually any highly or fully fluorinated chemical compound that exhibits surface active properties. In some embodiments, the fluorochemical surfactant is a nonionic surfactant. In certain presently preferred embodiments, the fluorochemical surfactant has the formula $R_1CH_2CH_2O(CH_2CH_2O)_xH$, where $R_1$ is $F(CF_2CF_2)_{3-8}$ and x is an integer$\geq 1$. Suitable fluorochemical surfactants include the Zonyl™ surfactants (manufactured by E.I. DuPont de Nemours Corp., Wilmington, Del.) and the Fluorad™ surfactants (manufactured by 3M Company, St. Paul, Minn.). Preferred fluorochemical surfactants include Zonyl™ FSN; and 3M L19909, 3M L19330, and 3M Novec™ 4432 surfactants.

The concentration of a fluorochemical surfactant ("concentration") useful in the processes of the present disclosure can be selected to control dielectric (e.g. silicon dioxide) removal rate, dielectric to barrier layer (e.g. silicon dioxide to silicon nitride) selectivity, or a combination thereof. In some exemplary embodiments, the fluorochemical surfactant concentration is selected to be greater than 0.005%. In certain exemplary embodiments, the fluorochemical surfactant concentration is selected to be at least 0.01% of the working liquid on a weight basis. In other exemplary embodiments, a fluorochemical surfactant concentration of at least 0.02% by weight may be used. In further exemplary embodiments, a fluorochemical surfactant concentration of at least 0.2% by weight may be used. In additional exemplary embodiments, a fluorochemical surfactant concentration of at least 0.6% by weight may be used.

The maximum preferred concentration of the fluorochemical surfactant may be readily determined, for example, by the onset of friction induced audible "squeeling" during CMP processing, which may occur at concentrations greater than about 0.2% by weight with some fluorochemical surfactants. Alternatively, the maximum preferred concentration may be determined, for example, by visual observation of undesirable slippage of the wafer during removal of the wafer from the fixed abrasive pad surface (i.e. "de-chucking"), which may occur at concentrations greater than about 0.5% by weight with some fluorochemical surfactants. In certain exemplary embodiments, a fluorochemical surfactant concentration of less than 1.0% may be used. In other exemplary embodiments, a fluorochemical surfactant concentration of no more than 0.6% may be used. In further exemplary embodiments, the fluorochemical surfactant concentration is no more than 0.2%, and in particular exemplary embodiments, no more than 0.02% on a weight basis of the working liquid.

Processing parameters for the present disclosure can be selected to achieve desired removal rates and/or selectivity by the skilled artisan guided by this disclosure. For example, the concentrations of proline and the fluorochemical surfactant, and the pH of the working liquid can be adjusted to control the removal rate of the dielectric material. In some embodiments, the concentration of the fluorochemical surfactant is adjusted to control the removal rate of the dielectric material. In order to determine the proper concentration of fluorochemical surfactant necessary to achieve the desired rate of removal or selectivity, a series of at least two working liquids having differing concentrations can be tested to determine the optimal concentration. Likewise, in order to determine the working liquid pH for the desired rate of removal or selectivity, a series of at least two working liquids having differing pH levels can be tested to determine the optimal pH level.

The removal rate of dielectric material (e.g. metal oxide such as silicon dioxide) may be, in some embodiments, an important characteristic of the fixed abrasive CMP process affected by the composition of the working fluid, particularly the concentration of the fluorochemical surfactant. In some embodiments, the working liquid is selected to have an Oxide Removal Rate of at least about 500 angstroms per minute (Å/min.). In other embodiments, the working liquid is selected to have an Oxide Removal Rate of at least 1000 Å/min. In further embodiments, the working liquid is selected to have an Oxide Removal Rate of at least 2,000 Å/min. In additional embodiments, the working liquid is selected to have an Oxide Removal Rate of at least 2,500 Å/min. In further embodiments, the working liquid is selected to have an Oxide Removal Rate of at least about 3,000 Å/min.

The Selectivity Ratio, that is, the ratio of the Oxide Removal Rate to the nitride removal rate, may be taken as a measure of stop on nitride selectivity useful in CMP and particularly useful in shallow trench isolation. In some embodiments, the working liquid is selected to have a dielectric (e.g. oxide) to barrier layer (e.g., nitride) Selectivity Ratio of at least about 5. In other embodiments, the working liquid is selected to have a dielectric to barrier layer Selectivity Ratio of at least about 20. In certain embodiments, the working liquid is selected to have a dielectric to barrier layer Selectivity Ratio of at least about 50. In additional embodiments, the working liquid is selected to have a dielectric to barrier layer Selectivity Ratio of at least about 100. In further embodiments, the working liquid is selected to have a dielectric to barrier layer Selectivity Ratio of at least about 250.

In further embodiments, the composition of the working fluid is selected, at least in part, to increase the Oxide Removal Rate and the Selectivity Ratio. In one embodiment of the present disclosure, the use of a fluorochemical surfactant with proline under alkaline pH conditions increases the Oxide Removal Rate while retaining the nitride removal rate in Shallow Trench Isolation (STI), thereby increasing the oxide over nitride Selectivity Ratio associated with the use of proline in the working fluid of a fixed abrasive CMP process for STI. In certain embodiments, the compositions of the present disclosure may produce an Oxide Removal Rate of at least about 500 Å/min. and an oxide over nitride Selectivity Ratio of at least 5. In some exemplary embodiments, the compositions of the present disclosure may produce an Oxide Removal Rate of at least 700 Å/min., and a Selectivity Ratio of at least 30. In other exemplary embodiments, the compositions of the present disclosure may produce an Oxide Removal Rate of at least 1000 Å/min. and an oxide over nitride Selectivity Ratio of at least 50. In further embodiments, the compositions of the present disclosure can be modified to produce an Oxide Removal Rate of at least 2000 Å/min. and an oxide over nitride Selectivity Ratio of at least 100. In additional embodiments, the compositions of the present disclosure can be modified to produce an Oxide Removal Rate of at least about 3000 Å/min. and an oxide over nitride Selectivity Ratio of at least 250.

Advantages and other embodiments of this invention are further illustrated by the following examples, but the particular materials and amounts thereof recited in these examples, as well as other conditions and details, should not be construed to unduly limit this invention. For example, composition of the working liquid and the cation selection and concentration can be varied. All parts and percentages are by weight unless otherwise indicated.

EXAMPLES

The material designations shown in TABLE 1 are used throughout the examples. All compositional percentages in the following Examples are expressed as a weight percent of the working liquid.

TABLE 1

| Fluorochemical Surfactants Used in the Examples | |
|---|---|
| Designation | Material |
| Zonyl ™ FSN | Fluorochemical surfactant having the general formula: $R_1CH_2CH_2O(CH_2CH_2O)_xH$, where $R_1$ is $F(CF_2CF_2)_{3-8}$ and x is an integer $\geq 1$, available from E.I. DuPont de Nemours Corp., Wilmington, DE |
| 3M L19909 | Fluorochemical surfactant, a solution of 85-95% w/w fluoroaliphatic polymeric esters and 5-10% w/w polyether polymer in <2% 1-methyl-2-pyrrolidinone/toluene/2-propenoic acid blend, available from 3M Company, St. Paul, MN |
| 3M L19330 | Fluorochemical surfactant, a solution of fluoroacrylate copolymer at 50% w/w/ in ethyl acetate, available from 3M Company, St. Paul, MN |
| 3M FC4432 | Fluorochemical surfactant, a solution of 87-93% w/w fluoroaliphatic polymeric esters and 5-10% w/w polyether polymer in <6% 1-methyl-2-pyrrolidinone/toluene/2-propenoic acid blend, available from 3M Company, St. Paul, MN |

Comparative Example A

The following polish tests were performed on a Mirra tool (from Applied Materials, Inc. of Santa Clara, Calif.) using an SWR542-125/10 three-dimensional, textured, fixed abrasive pad (from 3M Company, St. Paul, Minn.). Prior to each eleven wafer test sequence described, the previously used fixed abrasive pad was prepared by conditioning the surface for 36 seconds with a Morgan CMP-20000TS conditioner (Morgan Advanced Ceramics, Inc., Hayward, Calif.) at a down force of 4 kg (9 lbs) operating at 50 revolutions per minute (rpm) and five sweeps per minute in deionized water.

Following conditioning, ten 200 mm blanket tetraethylsilicate (TEOS) blanket wafers were polished for 60 seconds at 20.7 kPa (3 psi) and 30 rpm, using a working liquid comprising a 2.5% solution of L-proline in deionized water which had been adjusted to pH 10.5 using potassium hydroxide. Polishing solutions were supplied at 200 mL/min. The working liquid to be tested was then used to polish ten 200 mm TEOS blanket wafers to establish silicon Oxide Removal Rate followed by one previously cleared 0.17 micron DRAM wafer to establish silicon nitride removal rate. The removal rates were obtained by measuring the thickness of the respective materials before and after polishing using an Optiprobe 2600 (Therma-Wave, Fremont, Calif.). The polishing results using 2.5% L-proline at pH 10.5 without a fluorochemical surfactant in a fixed abrasive CMP process are presented in Table 2.

TABLE 2

Data from Comparative Example A

| Oxide Removal Rate (Å/min.) | Nitride Removal Rate (Å/min.) | Selectivity Ratio (Oxide/Nitride Removal Rates) |
|---|---|---|
| 455.9 | 13 | 35.07 |
| 582.67 | 26 | 22.41 |
| 646.5 | 23 | 28.11 |
| 491.4 | 28 | 17.55 |
| 409.9 | 22 | 18.63 |
| 387.1 | 13 | 29.78 |
| 368.5 | 25 | 14.74 |
| 477.42 | 21.43 | 23.76 |
| 104.01 | 6.08 | 7.43 |

Example 1

A working liquid containing 0.02% Zonyl FSN and 2.5% L-proline at pH 10.5 produced an average Oxide Removal Rate of 1006.90 Å/min., a nitride removal rate of 12.0 Å/min., and a Selectivity Ratio of 83.9.

Example 2

A working liquid containing 0.2% Zonyl FSN and 2.5% L-proline at pH 10.5 produced an average Oxide Removal Rate of 1250.80 Å/min., a nitride removal rate of 5.0 Å/min., and a Selectivity Ratio of 250.16.

Example 3

A working liquid containing 0.02% Zonyl FSN and 2.5% L-proline at pH 10.5 produced an average Oxide Removal Rate of 801.20 Å/min., a nitride removal rate of 11.0 Å/min., and a Selectivity Ratio of 72.83.

Example 4

A working liquid containing 0.2% Zonyl FSN and 2.5% L-proline at pH 10.5 produced an average Oxide Removal Rate of 1050.38 Å/min., a nitride removal rate of 29.0 Å/min., and a Selectivity Ratio of 38.11.

Comparative Example B

A series of seven sets of ten 200 mm TEOS blanket wafers and one previously cleared 0.17 micron dynamic random access memory (DRAM) wafer were polished using a working liquid containing 2.5% L-proline at pH 10.5. The Oxide Removal Rate was 477.42±104.01 Å/min., the silicon nitride removal rate was 21.43±6.08 Å/min., and the Selectivity Ratio was 23.76±7.43.

Additional tests were performed as follows. A new SWR542-125/10 three-dimensional, textured, fixed abrasive pad was initially conditioned for 300 seconds with a Morgan CMP-20000TS conditioner at a down force of 4 kg (9 lbs) operating at 50 rpm and 12 sweeps per minute in deionized water. Following conditioning, twenty five 200 mm blanket TEOS wafers were polished for 60 seconds at 20.7 kPa (3 psi) and 30 rpm, using a working liquid comprising a 2.5% solution of L-proline in deionized water which had been adjusted to pH 10.5 using potassium hydroxide. Prior to each 6 wafer test sequence, the pad was prepared by conditioning the surface for 5 minutes with a Morgan CMP-20000TS conditioner at a down force of 4 kg (9 lbs) operating at 50 rpm and 12 sweeps per minute in deionized water.

Following conditioning, five 200 mm blanket TEOS wafers were polished for 60 seconds at 20.7 kPa (3 pounds per square inch, psi) pressure and 30 rpm, using a working liquid comprising a 2.5% solution of L-proline in deionized water which had been adjusted to pH 10.5 using potassium hydroxide. Polishing solutions were supplied at 200 mL/min. The working liquid to be tested was then used to polish three 200 mm TEOS blanket wafers to establish the Oxide Removal Rate, followed by one previously cleared 0.17 micron DRAM wafer to establish silicon nitride removal rate. The removal rates were obtained by measuring the thickness of the respective materials before and after polishing using an Optiprobe 2600.

Example 5

A working liquid containing 0.2% 3M L19330 fluorochemical surfactant and 2.5% L-proline at pH 10.5 produced an average Oxide Removal Rate of 513.67 Å/min., a nitride removal rate of 2.0 Å/min., and a Selectivity Ratio of 256.83.

Comparative Example C

This Comparative Example illustrates use of a fluorochemical surfactant below an amount effective to obtain an Oxide Removal Rate of 500 Å/min. A working liquid containing 0.005% 3M L19909 and 2.5% L-proline at pH 11.0 produced an average Oxide Removal Rate of 260.33 Å/min., a nitride removal rate of 24.0 Å/min., and a Selectivity Ratio of 10.84.

Example 6

A working liquid containing 0.02% 3M L19909 and 2.5% L-proline at pH 11.0 produced an average Oxide Removal Rate of 705.33 Å/min., a nitride removal rate of 8.0 Å/min., and a Selectivity Ratio of 88.16.

Example 7

A working liquid containing 0.2% 3M L19909 and 2.5% L-proline at pH 11.0 produced an average Oxide Removal Rate of 547.00 Å/min., a nitride removal rate of 9.0 Å/min., and a Selectivity Ratio of 60.78.

The results for Examples 1-8 and Comparative Example B and C are summarized in Table 3.

TABLE 3

Data from Examples 1-8 and Comparative Examples B and C

| Example | Oxide Removal Rate (Å/min.) | Nitride Removal Rate (Å/min.) | Selectivity Ratio (Oxide/Nitride Removal Rates) |
|---|---|---|---|
| 1 | 1006.90 | 12.0 | 83.90 |
| 2 | 1250.80 | 5.0 | 250.16 |
| 3 | 801.20 | 11.0 | 72.83 |
| 4 | 1050.38 | 29.0 | 38.11 |
| 5 | 513.76 | 2.0 | 256.83 |
| 6 | 547.0 | 9.0 | 88.16 |
| 7 | 547.0 | 9.0 | 60.78 |
| Comparative B | 477.42 | 21.43 | 23.76 |
| Comparative C | 260.33 | 24.0 | 10.84 |

Comparative Example D

A series of three sets of three 200 mm TEOS blanket wafers were polished using a working liquid containing 2.5% L-proline at pH 10.5. The Oxide Removal Rate was 475.55 Å/min.

Example 9

Three fluorochemical surfactants (3M L19909, 3M FC4432, and DuPont Zonyl FSN, described in Table 1) were individually evaluated at varying concentration in working liquids with 2.5% L-proline at pH 10.5 and a SWR542-125/10 fixed abrasive pad (available from 3M Company, St. Paul, Minn.) in a MIRRA CMP POLISHER (available from Applied Materials, Santa Clara, Calif.). A used SWR542 pad was placed in a Mirra carrier. This pad was first broken-in with 5 minutes of conditioning at 4 kg (9 pounds) of force, 50 rpm, and 12 sweeps per minute in deionized water. Ten blanket TEOS wafers were run for 60 seconds at 20.7 kPa (3 psi) pressure and 30 rpm in a working liquid of 2.5% L-proline at a pH of 10.5. Then a series of working liquids were run in the following manner:

1. A 5 minute conditioning cycle (as described above) was run;
2. Five blanket TEOS wafers were run as described above in the L-proline chemistry;
3. Five blanket TEOS wafers were run as described above in the L-proline chemistry with a fluorochemical surfactant added at the concentrations indicated in Table 4.

As shown in Table 4, at the 0.02% surfactant concentrations, the 3M L19909 and provided polishing rates that were at least as high as the Zonyl FSN, approximately double the control without fluorochemical surfactant. At the 0.2% concentrations, the Oxide Removal Rate was even higher, but more friction was experienced with the FC4432 and L19909 surfactants. The friction produced a loud high-pitched "squealing" noise during polishing. Additionally, several wafers slipped during de-chuck (the removal of the wafer from the pad surface) at the 0.6% concentrations of the 3M FC4432 and 3M L19909. The Zonyl FSN did not exhibit the friction-induced squealing, nor the wafer slippage during dechuck.

TABLE 4

Data from Example 9 and Comparative Example C

| Example | Oxide Removal Rate (Å/min.) | Nitride Removal Rate (Å/min.) | Selectivity Ratio (Oxide/Nitride Removal Rates) |
|---|---|---|---|
| 0.02% FC4432 | 1079.4 | 90.17 | 11.97 |
| 0.2% FC4432 | 2967.4 | 235.17 | 12.62 |
| 0.6% FC4432 | 2567.6 | 122.6 | 20.94 |
| 0.02% L19909 | 1729.8 | 63.76 | 27.13 |
| 0.2% L19909 | 2227.40 | 158.13 | 14.09 |
| 0.6% L19909 | 2248.2 | 264.84 | 8.49 |
| 0.02% Zonyl FSN | 1059.2 | 45.21 | 23.43 |
| 0.2% Zonyl FSN | 1307.6 | 180.85 | 7.23 |
| Comparative D | 414.81 | 16.07 | 25.81 |

It is to be understood that even in the numerous characteristics and advantages of the present disclosure set forth in the above disclosure, together with details of the structure and function of the invention, the disclosure is illustrative only. Changes can be made to detail, especially in matters of the surfactant concentration in the working liquid and methods of use within the principles of the invention to the full extent indicated by the meaning of the terms in which the appended claims are expressed and the equivalents of those structures and methods.

It should also be apparent to those skilled in the art from the above description that various modifications can be made without departing from the scope and principles of this disclosure, and it should be understood that this disclosure may be not to be unduly limited to the illustrative embodiments set forth hereinabove. All publications and patents are herein incorporated by reference to the same extent as if each individual publication or patent was specifically and individually indicated to be incorporated by reference. Various embodiments of the disclosure have been described. These and other embodiments are within the scope of the following claims.

We claim:

1. A working liquid for fixed abrasive chemical mechanical planarization comprising:
    proline, wherein the concentration of proline is from 1.0% to 4% on a weight basis; and
    a fluorochemical surfactant having the formula $R_1CH_2CH_2O(CH_2CH_2O)_xH$, where $R_1$ is $F(CF_2CF_2)_{3-8}$ and x is an integer greater than 1;
    wherein the working liquid for fixed abrasive chemical mechanical planarization is substantially free of abrasive particles, and wherein the proline and the fluorochemical surfactant are each present in an amount effective to obtain an Oxide Removal Rate of at least 500 angstroms/minute (Å/min) and a Selectivity Ratio of at least 5 when the working liquid is used in chemical mechanical planarization of a wafer having a first region comprising silicon dioxide and a second region comprising silicon nitride.

2. The working liquid of claim 1, wherein the Oxide Removal Rate is at least 700 Å/min.

3. The working liquid of claim 1, wherein the Selectivity Ratio is at least 30.

4. The working liquid of claim 1, wherein the working liquid exhibits a pH from 9 to 11.

5. The working liquid of claim 1, wherein the working liquid exhibits a pH from 10 to 10.5.

6. The working liquid of claim 1, wherein the fluorochemical surfactant is a nonionic surfactant.

7. The working liquid of claim 1, wherein $R_1$ is $F(CF_2CF_2)_{5-8}$.

8. The working liquid of claim 1, wherein the concentration of the fluorochemical surfactant is greater than 0.005% and less than 1.0% on a weight basis.

9. The working liquid of claim 1, wherein the concentration of the fluorochemical surfactant is from 0.2% to 0.6% on a weight basis.

10. The working liquid of claim 1, wherein the concentration of proline is from 2.0% to 3% on a weight basis.

11. A method of chemical mechanical planarization of a wafer comprising:
    providing a wafer having a first surface region comprising a dielectric oxide, and a second surface region comprising a barrier nitride;
    contacting the first and second surface regions with a three-dimensional, textured, fixed abrasive article comprising precisely shaped abrasive composites further comprising a plurality of abrasive particles and a binder; and
    relatively moving the wafer and the fixed abrasive article in the presence of a liquid medium comprising proline and a fluorochemical surfactant, wherein a concentration of proline in the liquid medium is from 1.0% to 5% on a weight basis.

12. The method of claim 11, wherein the liquid medium exhibits a pH from 9 to 11.

13. The method of claim 11, wherein the fluorochemical surfactant has the formula $R_1CH_2CH_2O(CH_2CH_2O)_xH$, where $R_1$ is $F(CF_2CF_2)_{5-8}$.

14. The method of claim 11, wherein a concentration of the fluorochemical surfactant in the liquid medium is greater than 0.005% and less than 1.0% on a weight basis.

15. The method of claim 11, wherein the Oxide Removal Rate is at least 700 Å/min.

16. The method of claim 15, wherein the Selectivity Ratio is at least 5.

* * * * *

UNITED STATES PATENT AND TRADEMARK OFFICE
CERTIFICATE OF CORRECTION

PATENT NO. : 8,591,764 B2  
APPLICATION NO. : 11/613646  
DATED : November 26, 2013  
INVENTOR(S) : John Gagliardi Page 1 of 1

It is certified that error appears in the above-identified patent and that said Letters Patent is hereby corrected as shown below:

In the Specification

Column 6
Line 37, delete ""squeeling"" and insert -- "squealing" --, therefor.

Column 8
Lines 19-20, delete "F(CF$_2$CF$_3^-$$_8$" and insert -- F(CF$_2$CF$_2$)$_{3-8}$ --, therefor.

Column 11
Line 36, delete "dechuck." and insert -- de-chuck. --, therefor.

Signed and Sealed this
Ninth Day of September, 2014

Michelle K. Lee
*Deputy Director of the United States Patent and Trademark Office*